(12) United States Patent
Hsu

(10) Patent No.: US 7,811,672 B2
(45) Date of Patent: Oct. 12, 2010

(54) LED LAMPSHADE INJECTION-MOLDED OR PRESSURE CAST WITH AN IMD FILM

(75) Inventor: Sheng-Li Hsu, Taipei Hsien (TW)

(73) Assignee: ULT Technology Co., Ltd., San-Chung, Taipei Hsien (TW)

( * ) Notice: Subject to any disclaimer, the term of this patent is extended or adjusted under 35 U.S.C. 154(b) by 926 days.

(21) Appl. No.: 11/668,855

(22) Filed: Jan. 30, 2007

(65) Prior Publication Data

US 2008/0180957 A1 Jul. 31, 2008

(51) Int. Cl.
*B32B 27/00* (2006.01)
(52) U.S. Cl. .................. 428/542.2; 428/412; 428/913.3; 362/84; 362/260; 362/351
(58) Field of Classification Search .................. 428/412, 428/542.2, 913.3; 362/84, 260, 351
See application file for complete search history.

(56) References Cited

U.S. PATENT DOCUMENTS 6,544,634 B1 * 4/2003 Abrams et al. .............. 428/212

7,547,113 B2 * 6/2009 Lee ............................. 362/231

* cited by examiner

Primary Examiner—David R Sample
Assistant Examiner—Lawrence D Ferguson
(74) Attorney, Agent, or Firm—Pai Patent & Trademark Law Firm; Chao-Chang David Pai

(57) ABSTRACT

A LED lampshade suitable for mass production and characterized by extended LED working life is disclosed having a plastic lampshade body made by means of injection molding or pressure casting, and an in-mold decoration film directly bonded to the plastic lampshade body during the injection molding or pressure casting process. The in-mold decoration film comprises a base layer, a release layer covered on the base layer, a printing layer of a fluorescent substance or ink of a predetermined color, and an adhesive layer covered on the printing layer for bonding to the plastic lampshade body. The LED lampshade can be used with a blue LED to produce white light. The printing layer can be printed with different color inks for producing light of different colors.

7 Claims, 6 Drawing Sheets

LED LAMPSHADE INJECTION-MOLDED OR PRESSURE CAST WITH AN IMD FILM

BACKGROUND OF THE INVENTION (a) Field of the Invention

The present invention relates to a lampshade for LED and more particularly to a LED lampshade injection-molded or pressure cast with an IMD (In-Mold Decoration) film, which allows quick dissipation of heat from the LED, and can be used with a blue LED to produce white and light of different colors.

(b) Description of the Prior Art

An IMD film is for decorating a device during the molding or pressure casting cycle. Many plastic components, such as shells for cell phones, cosmetics cases, key pads, automobile parts, information and electric component parts, etc. need a special surface finish to appear in high quality. IMD is one of the most efficient and cost-effective choices for that purpose. In-Mold Decoration (IMD) can provide several important advantages over other decoration methods.

Further, during the fabrication of LEDs (light emitting diodes), silicon rubber containing a fluorescent substance is applied to LED chips by a resin dispenser and then encapsulated with a packaging resin. The silicon rubber may contain yellow, red, or green fluorescent substance for changing the color of the light of the LED chip, for example, for producing white light. However, this resin dispensing procedure is not suitable for mass production.

The aforesaid conventional method is to embed LED chip in the silicon rubber. Because the silicon rubber fills up the gap in the LED lamp around the LED chip, heat cannot be quickly dissipated from the LED chip during the operation of the LED lamp. Under the effect of heat, the silicon rubber cracks easily, and the lead wires of the LED chip may break. Therefore, regular LEDs are suitable for low power application only, not practical for high power application.

Further, among color LEDS, blue color LEDs are most popularly used for the advantage in lowest manufacturing cost. A packaging material containing a fluorescent substance can be used to change the color of the light of a blue LED into white color. However, this design has the drawbacks of high labor cost, low yield rate, and short LED working life.

SUMMARY OF THE INVENTION

The present invention has been accomplished under the circumstances in view. According to one aspect of the present invention, the LED lampshade comprises a plastic lampshade body made by means of injection molding or pressure casting, and an in-mold decoration film directly bonded to the plastic lampshade body during the formation of the plastic lampshade body by injection molding or pressure casting. The in-mold decoration film comprises a transparent base layer, a release layer covered on one side of the transparent base layer, a printing layer prepared from a color fluorescent material or color ink and printed on one side of the release layer opposite to the transparent base layer, and an adhesive layer covered on one side of the printing layer opposite to the release layer by printing. This method is suitable for mass production to lower the cost and to improve the yield rate. By selecting the color of the fluorescent substance, the LED lampshade can change the light of a blue LED chip into white light.

According to another aspect of the present invention, the LED lampshade is covered on the chip carrier of a LED lamp around the LED chip and lead wires. After packaging of the LED lampshade, a hollow space is defined in the LED lamp around the LED chip and the lead wires for dissipation of heat. Therefore, a LED lamp made according to the present invention is suitable for high power illumination application.

According to still another aspect of the present invention, the printing layer can be formed of a yellow fluorescent substance or a fluorescent mixture of a red fluorescent substance and a green fluorescent substance, so that the LED lamp can be used with a LED to produce white light.

According to still another aspect of the present invention, a color ink layer may be sandwiched between the printing layer and the adhesive layer so that the LED lamp can be used with a LED to produce a predetermined color of light.

DETAILED DESCRIPTION OF THE PREFERRED EMBODIMENTS

A LED lampshade is injection-molded or pressure cast from a plastic material with an IMD (In-Mold Decoration) film 10. The IMD film 10 is made by means of a printing machine or printer. The IMD film 10 is bonded to the surface of a LED lampshade during the injection molding or extrusion process of the LED lampshade. Said printing machine can be a coater, a screen printing press, a gravure printing press, or a flexo printing press. Said printer can be a laser color printer or an ink-jet color printer.

Figure 1:
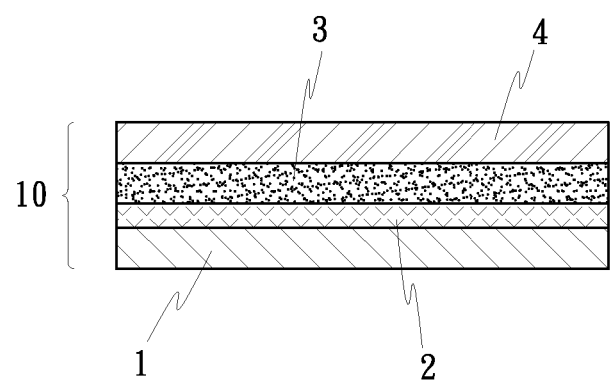
FIG. 1 is a sectional view of an IMD film according to the present invention.

Referring to FIG. 1, the aforesaid IMD film 10 comprises a base layer 1, a release layer 2 covered on the base layer 1, a printing layer 3 covered on the release layer 2 opposite to the base layer 1, and an adhesive layer 4 covered on the printing layer 3 opposite to the release layer 2 and the base layer 1.

The base layer 1 can be a sheet of PET (polyester), PMMA (poly(methyl methacrylate)), PC (polycarbonate), ABS (acrylonitrile butadiene styrene), PS (polystyrene), any other transparent inorganic or organic chemical compound, or any transparent paper material.

The release layer 2 is a sheet of transparent or colored hydrophilic inorganic or organic chemical compound.

The printing layer 3 is a sheet of a transparent resin, inorganic or organic chemical fluorescent substance. Preferably, the printing layer 3 is prepared from a yellow fluorescent substance or a fluorescent mixture of a red fluorescent substance and a green fluorescent substance. The release layer 2 is sandwiched between the base layer 1 and the printing layer 3. The printing layer 3 is covered on the release layer 3 by means of printing.

The adhesive layer 4 is directly covered on the printing layer 3 by means of printing.

The IMD film 10 thus obtained is directly bonded to the assigned surface area (either on the inside surface or the outside surface) of the LED lampshade during the injection molding or pressure casting process of the LED lampshade.

A LED lampshade injection-molded or pressure cast with an IMD film in accordance with the present invention is packaged on a part of the periphery of a LED chip, for example, a blue color LED chip, to allow dissipation of heat during the operation of the LED chip to prevent burnout of soldering wires and to extend the working life of the LED chip. Therefore, a LED lamp constructed according to the present invention is suitable for use in a high power lighting fixture or backlight module.

The printing layer 3 of the IMD film 10 is preferably prepared from a yellow fluorescent substance or a fluorescent mixture of a red fluorescent substance and a green fluorescent substance to match with a blue color LED chip for producing white light.

Figure 2:
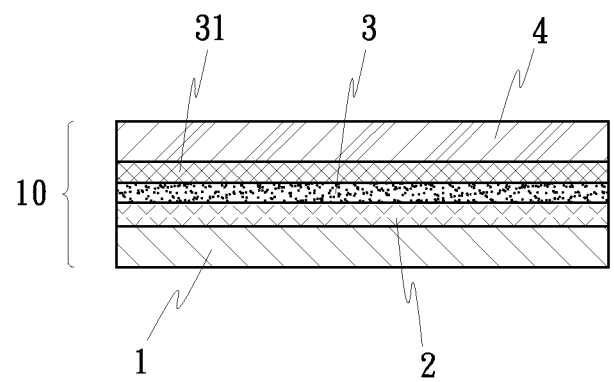
FIG. 2 is a sectional view of an alternate form of the IMD film according to the present invention.

FIG. 2 is a sectional view of an alternate form of the IMD film 10 according to the present invention. According to this embodiment, the IMD film 10 further comprises a color ink layer 31 sandwiched between the printing layer 3 and the adhesive layer 4. The color of the color ink layer 31 determines the color of the light of the LED passing through the IMD film 10.

Figure 3:
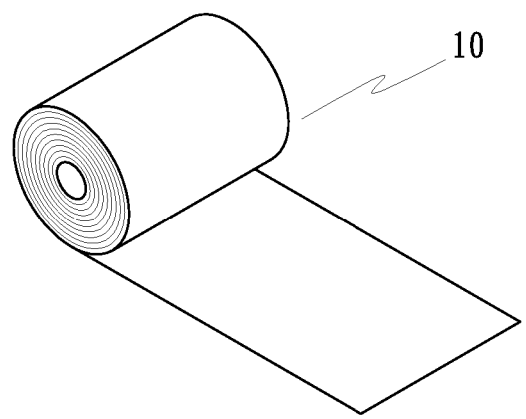
FIG. 3 illustrates a roll of IMD film according to the present invention.
Figure 4:
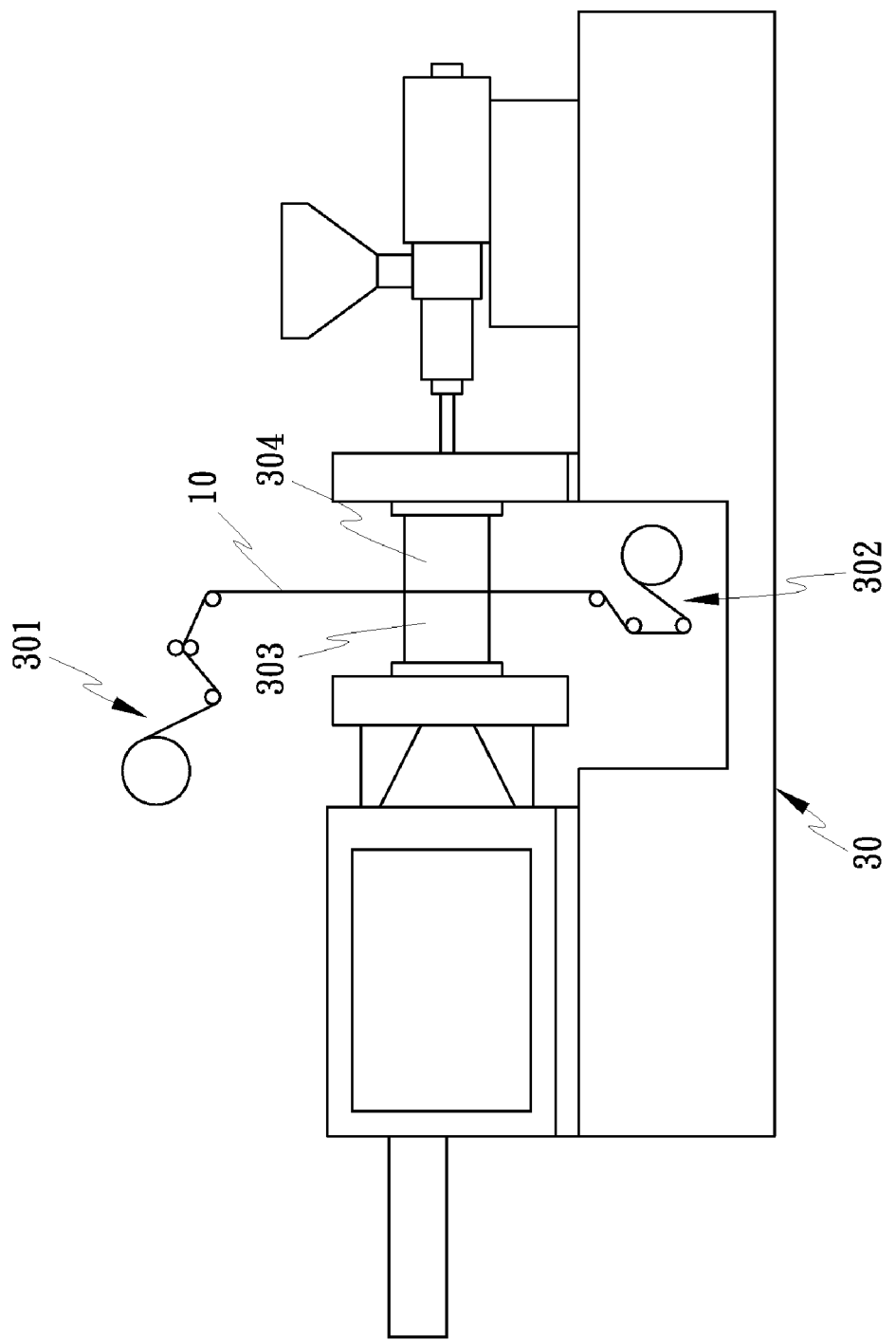
FIG. 4 illustrates a roll of IMD film being used in a plastic injection molding machine according to the present invention.

FIG. 3 illustrates a roll of IMD film 10 for use in a plastic injection molding or pressure casting process to form a lampshade directly on a LED chip. As shown in FIG. 4, the roll of IMD film 10 is mounted on a feed reel 301 in a plastic injection molding machine 30, and the lead end of the IMD film 10 is inserted through the gap between the male die 303 and the female die 304 of a LED lampshade injection molding mold in the plastic injection molding machine 30 and then the lead end of the base layer 1 of the IMD film 10 is connected to a take-up reel 302.

Figure 5:
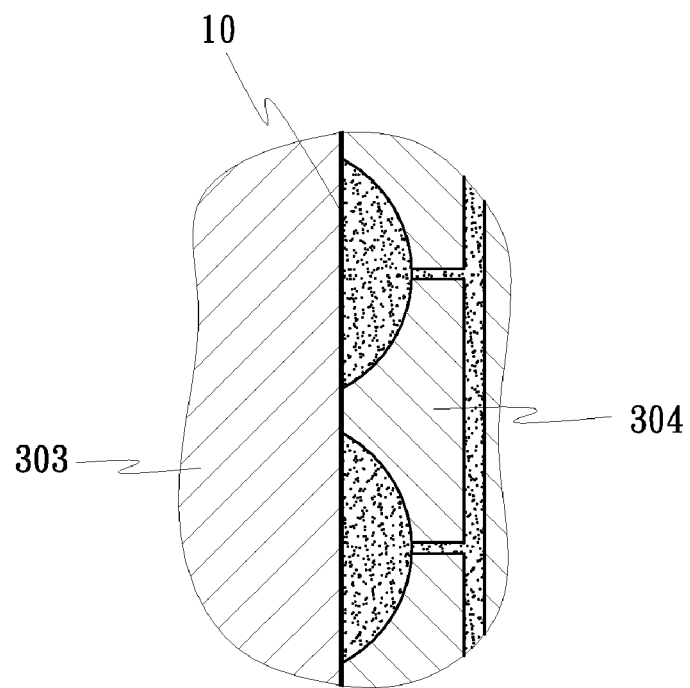
FIG. 5 is an enlarged view of a part of FIG. 4, showing the IMD film extended through the gap between the male die and the female die.
Figure 6:
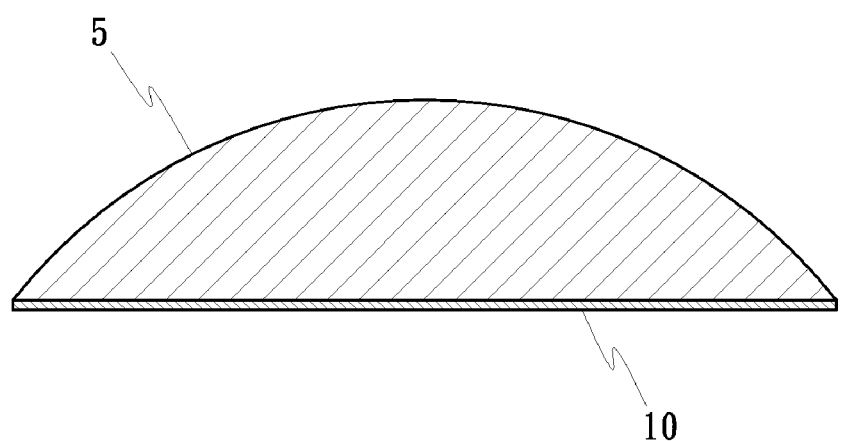
FIG. 6 illustrates a predetermined unit of the IMD film bonded to a LED lampshade according to the present invention.

FIG. 5 is an enlarged view of a part of FIG. 4, showing the IMD film 10 extending through the gap between the male die 303 and the female die 304. FIG. 6 illustrates a predetermined unit of the IMD film 10 bonded to a LED lampshade 5.

Figure 7:
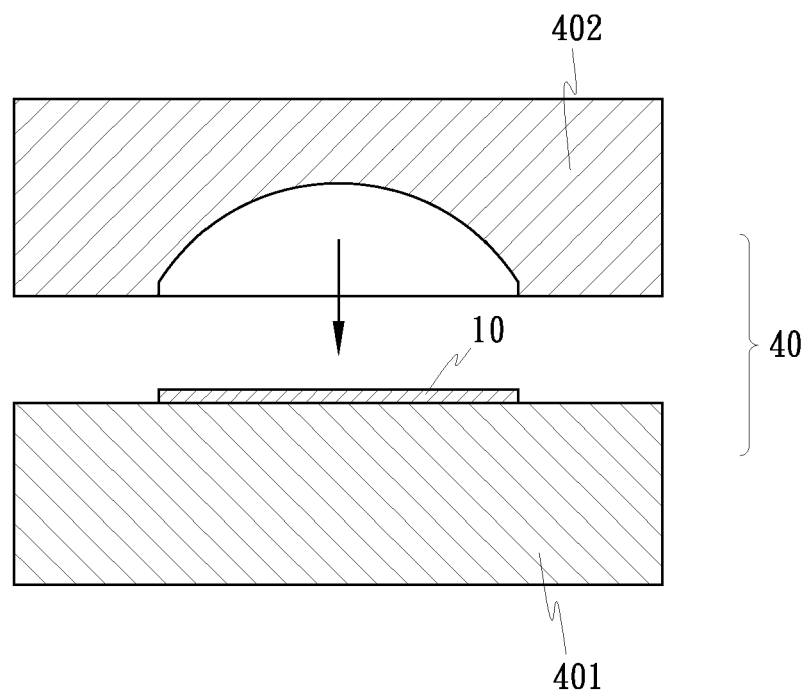
FIG. 7 is a schematic drawing showing an IMD film set in between the male die and female die of a LED lampshade pressure casting or extrusion mold in a plastic extrusion machine.

FIG. 7 is a schematic drawing showing the IMD film 10 set in between the male die 401 and the female die 402 of a LED lampshade pressure casting or extrusion mold in a plastic extrusion machine 40. The male die 303 and the female die 304 of the LED lampshade injection molding mold or the male die 401 and female die 402 of the LED lampshade pressure casting or extrusion mold are configured according to the desired lampshade design, and the material filling hole can be selectively formed in the male die or in the female die for the filling of the selected plastic material.

Figure 8:
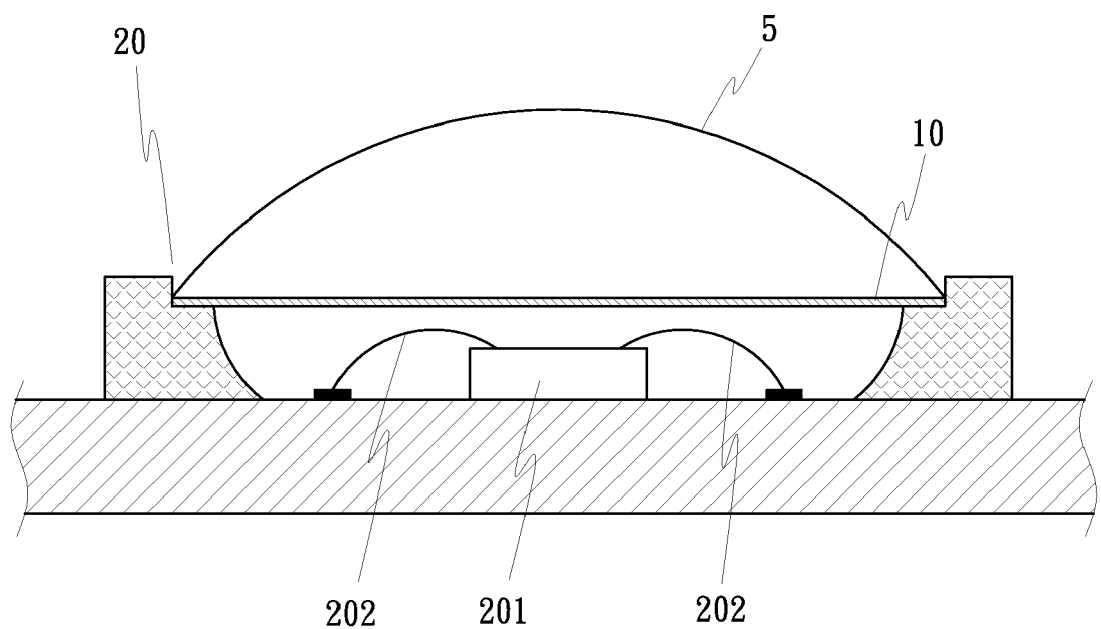
FIG. 8 illustrates an IMD film-bonded LED lampshade packaged on a LED lamp according to the present invention.

FIG. 8 illustrates an IMD film-bonded LED lampshade 5 packaged on a LED lamp 20 according to the present invention. The LED lampshade 5 is covered on the chip carrier of the LED lamp 20 around the LED chip 201 and the lead wires 202. After packaging of the LED lampshade 5, a hollow space is defined in the LED lamp 20 around the LED chip 201 and the lead wires 202 for dissipation of heat. Therefore, the LED lamp 20 is suitable for high power illumination application.

Figure 9:
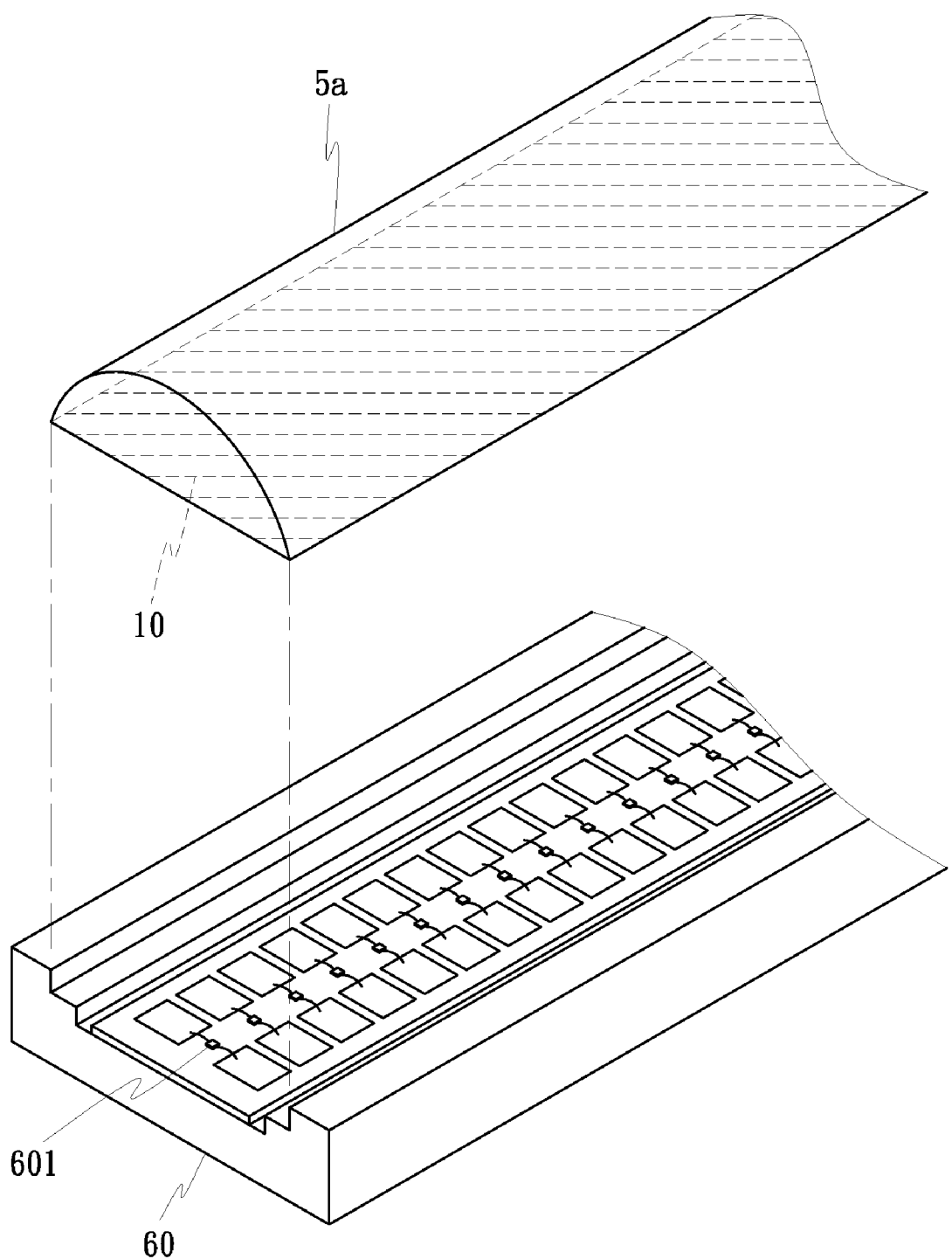
FIG. 9 illustrates a LED lamp formed of a set of LED chips carried on a circuit board and a LED lampshade with an integrated IMD film according to the present invention.

FIG. 9 illustrates a LED lampshade 5 having an IMD film 10 integrated on its bottom surface for covering multiple LED chips 601 on a circuit board 60 to constitute a LED lamp.

Figure 10:
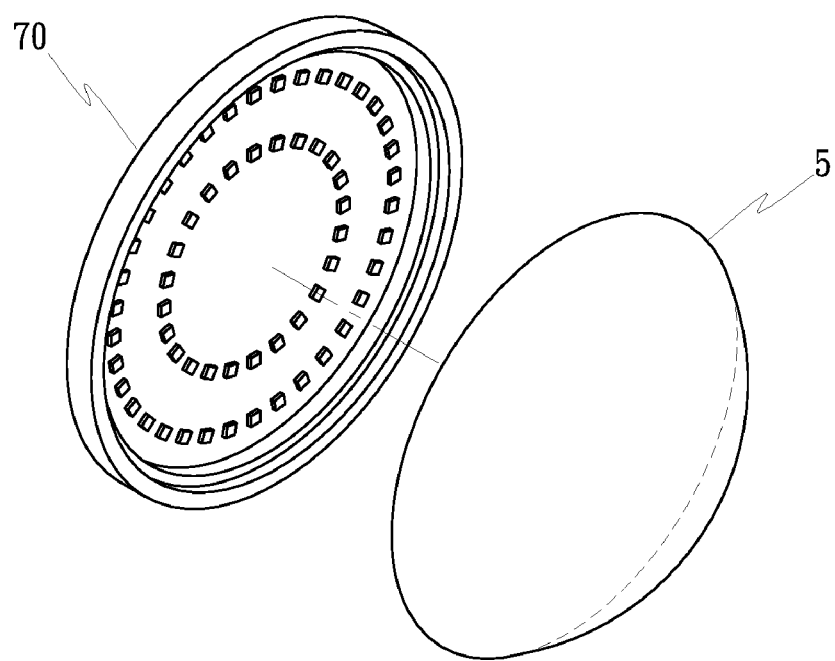
FIG. 10 illustrates a LED car lamp formed of a circular lamp holder and a LED lampshade with an integrated IMD film according to the present invention.

FIG. 10 illustrates a LED car lamp formed of a circular lamp holder 70 and a LED lampshade 5 with an integrated IMD film (not shown) according to the present invention.

Figure 11:
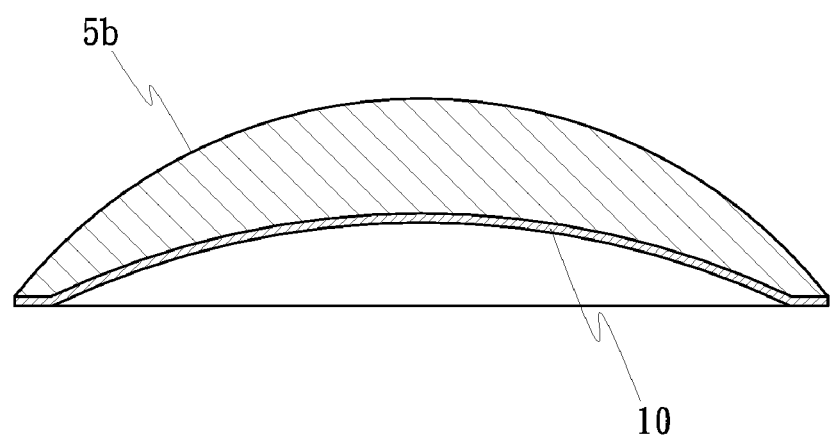
FIG. 11 is a schematic drawing illustrating an IMD film integrated on an arched bottom wall of a LED lampshade according to the present invention.

FIG. 11 is a schematic drawing illustrating an IMD film 10 integrated on an arched bottom wall of a LED lampshade 5b according to the present invention.

A prototype of LED lampshade injection-molded with an IMD film and another prototype of LED lampshade pressure cast with an IMD film have been constructed with the features of FIGS. 1~11. Both lampshade prototypes function smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An LED lampshade comprising a plastic lampshade body made by means of one of an injection molding process and an pressure casting process, and an in-mold decoration film directly bonded to said plastic lampshade body during formation of said plastic lampshade body by means of one of the injection molding process and the pressure casting process, wherein said in-mold decoration film comprises:

a transparent base layer formed of a material selected from the group consisting of PET (polyester), PMMA (poly (methyl methacrylate)), PC (polycarbonate), ABS (acrylonitrile butadiene styrene), PS (polystyrene), and paper;

a release layer covered on one side of said transparent base layer, said release layer being prepared from a transparent or colored hydrophilic material;

a printing layer covered on one side of said release layer opposite to said transparent base layer by a printing machine, said printing layer being prepared from one of color fluorescent materials and color inks; and an adhesive layer covered on one side of said printing layer opposite to said release layer by a printing machine.

2. The LED lampshade as claimed in claim 1, wherein each of the printing machines is selected from the group consisting of a coater, a screen printing press, a gravure printing press, and a flexo printing press.

3. The LED lampshade as claimed in claim 1, wherein each of the printing machines is a laser color printer or an ink-jet color printer.

4. The LED lampshade as claimed in claim 1, wherein said printing layer is formed of a yellow fluorescent substance.

5. The LED lampshade as claimed in claim 1, wherein said printing layer is formed of a fluorescent mixture of a red fluorescent substance and a green fluorescent substance.

6. The LED lampshade as claimed in claim 1, wherein said printing layer is a color ink of a predetermined color.

7. A LED lamp comprising the LED lampshade as claimed in claim 1 and a blue LED chip.

* * * * *